(12) United States Patent
Yoshimura et al.

(10) Patent No.: US 8,513,088 B2
(45) Date of Patent: Aug. 20, 2013

(54) SEMICONDUCTOR DEVICE AND METHOD FOR MANUFACTURING THE SAME

(75) Inventors: Atsushi Yoshimura, Yokkaichi (JP); Fumihiro Iwami, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 27 days.

(21) Appl. No.: 13/233,203

(22) Filed: Sep. 15, 2011

(65) Prior Publication Data

US 2012/0199993 A1    Aug. 9, 2012

(30) Foreign Application Priority Data

Feb. 4, 2011   (JP) ................................. P2011-022621

(51) Int. Cl.
*H01L 21/00* (2006.01)
(52) U.S. Cl.
USPC .................................. 438/424; 257/E21.599
(58) Field of Classification Search
USPC ......... 438/462, 456–458, 113–114, 118–119, 438/422, 421, 424–426; 257/E21.599, E21.24
See application file for complete search history.

(56) References Cited

U.S. PATENT DOCUMENTS

| | | | | |
|---|---|---|---|---|
| 5,749,994 A | * | 5/1998 | Sundet | 156/230 |
| 7,051,428 B2 | * | 5/2006 | Jeong et al. | 29/729 |

FOREIGN PATENT DOCUMENTS

| | | |
|---|---|---|
| JP | 2006-93213 | 4/2006 |
| JP | 2006-120850 | 5/2006 |

\* cited by examiner

*Primary Examiner* — Hoa B Trinh
(74) *Attorney, Agent, or Firm* — Oblon, Spivak, McClelland, Maier & Neustadt, L.L.P.

(57) ABSTRACT

In one embodiment, an adhesive layer is formed by applying a liquid adhesive to a semiconductor wafer whose wafer shape is maintained by a surface protective film attached to a first surface. A supporting sheet having a tacky layer is attached to a second surface of the semiconductor wafer. After the surface protective film is peeled, the supporting sheet is expanded to cleave the adhesive layer including the adhesive filled into the dicing grooves. The first surface of the semiconductor wafer is cleaned while an expansion state of the supporting sheet is maintained. Tack strength of portions corresponding to the dicing grooves of the tacky layer is selectively reduced before cleaning.

19 Claims, 7 Drawing Sheets

SEMICONDUCTOR DEVICE AND METHOD FOR MANUFACTURING THE SAME

CROSS-REFERENCE TO RELATED APPLICATION

This application is based upon and claims the benefit of priority from the prior Japanese Patent Application No. 2011-022621, filed on Feb. 4, 2011; the entire contents of which are incorporated herein by reference.

FIELD

Embodiments described herein relate generally to a semiconductor device and a method for manufacturing the same.

BACKGROUND

Manufacturing processes of a semiconductor device (semiconductor chip) are classified broadly into a process of forming a semiconductor element part which has a semiconductor circuit, a wiring layer and the like in correspondence with a chip area in a surface of a semiconductor wafer, and a process (segmenting process) of cutting the semiconductor wafer in correspondence with the chip area (chip shape). In processing the semiconductor wafer, a process called dicing before grinding is applied as a processing process to combine film thinning of a wafer with segmentation of a chip. In the dicing before grinding process, first, there is formed a groove which is shallower than a wafer thickness and deeper than a chip thickness after completion in a semiconductor wafer from a front surface side in which a semiconductor element part is formed. Next, after a protective film is attached to a front surface of the semiconductor wafer, a rear surface of the semiconductor wafer is ground, so that the semiconductor wafer is segmented into respective chips.

A sheet-shaped adhesive film and supporting film are attached to the rear surface of the semiconductor wafer whose entire shape is maintained by a surface protective film. The adhesive film functions as an adhesive layer for each chip and is cut (segmented) in correspondence with each chip shape. The adhesive film is cut, after the surface protective film is peeled for example, by radiating a laser beam along a dicing groove from the front surface side of the semiconductor wafer. There is suggested a method in which the adhesive film is cut as a result that the supporting film to which the semiconductor wafer is attached is expanded in a horizontal direction to selectively modify the adhesive film existing between the chips.

In a method for cutting the adhesive film by the laser beam, since an alignment property of the chips is apt to deteriorate in repetition of attaching of the semiconductor wafer, a cutting speed of the adhesive film is reduced and the number of cutting actions tends to increase. Further, there is a possibility that waste occurring at a time of cutting the adhesive film by the laser beam contaminates the semiconductor chip. In the method for selectively modifying the adhesive film, a cost necessary for modification tends to increase a cutting cost, and there is a possibility that a cutting property of the adhesive film cannot be sufficiently heightened depending on modifying methods. Thus, in forming an adhesive layer in a rear surface of a semiconductor wafer segmented in a chip shape by dicing before grinding or the like, it is required to heighten a cutting property of the adhesive layer and to suppress contamination or the like of a semiconductor chip at a time of cutting of the adhesive layer.

DETAILED DESCRIPTION

According to one embodiment, there is provided a method for manufacturing a semiconductor device including, preparing a semiconductor wafer having a plurality of chip areas segmented by dicing grooves, a wafer shape of the semiconductor device being maintained by a surface protective film attached to a first surface of the semiconductor device, forming an adhesive layer by applying a liquid adhesive to a second surface in an opposite side of the first surface of the semiconductor wafer while filling the liquid adhesive into at least part of the dicing grooves, attaching a supporting sheet having a tacky layer whose tack strength can be reduced to the second surface of the semiconductor wafer via the adhesive layer, peeling the surface protective film from the first surface of the semiconductor wafer, cleaving the adhesive layer including the adhesive filled into the dicing grooves by expanding the supporting sheet attached to the semiconductor wafer, and cleaning the first surface of the semiconductor wafer and the inside of the dicing groove while maintaining a state that the supporting sheet is expanded. In the manufacturing method of the embodiment, the tack strength of portions corresponding to the dicing grooves of the tacky layer is selectively reduced before the semiconductor wafer is cleaned.

Figure 1A:
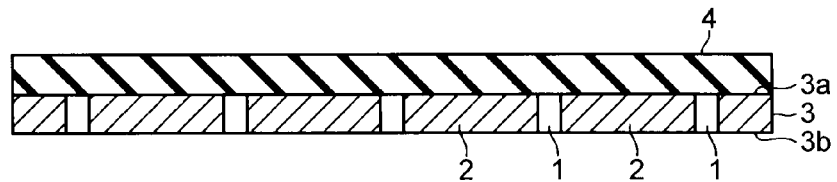
FIG. 1A to FIG. 1D are cross-sectional diagrams illustrating a method for manufacturing a semiconductor device according to an embodiment.

A method for manufacturing a semiconductor device according to an embodiment will be described with reference to the drawings. FIG. 1A to FIG. 1D are diagrams illustrating the method for manufacturing the semiconductor device according to the embodiment. First, as illustrated in FIG. 1A, a semiconductor wafer 3 having a plurality of chip areas 2, 2 . . . which are segmented by dicing grooves 1 is prepared. A surface protective film 4 is attached to a first surface 3a being an element forming surface of the semiconductor wafer 3. Though the semiconductor wafer 3 is segmented into the respective chip areas 2, a wafer shape thereof is maintained by the surface protective film 4 attached to the first surface 3a.

Such a semiconductor wafer 3 is fabricated by a dicing-before-grinding process, for example.

Figure 2A:
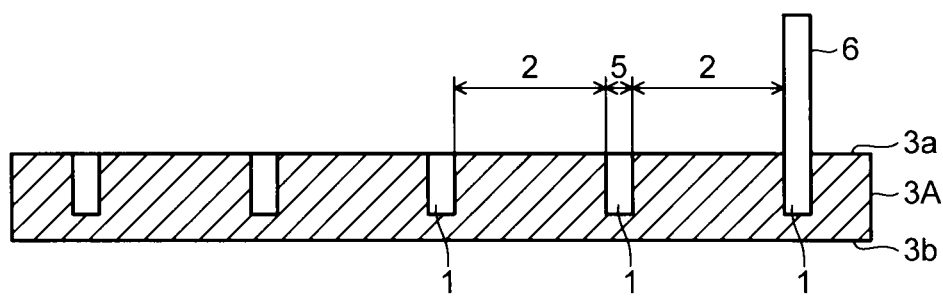
FIG. 2A to FIG. 2C are cross-sectional diagrams illustrating a dicing-before-grinding process of a semiconductor wafer in the method for manufacturing the semiconductor device of the embodiment.

The dicing-before-grinding process of the semiconductor wafer 3 will be described with reference to FIG. 2A to FIG. 2C. As illustrated in FIG. 2A, a semiconductor wafer 3A in which a semiconductor element part having a semiconductor circuit, a wiring layer and the like are formed is prepared. The semiconductor wafer 3A has a first surface (front surface) 3a being an element forming surface and a second surface (rear surface) 3b in an opposite side thereto. The semiconductor wafer 3A has a plurality of chip areas 2, 2 . . . . The semiconductor element part having the semiconductor circuit and the wiring layer is formed in a first surface 3a of each of chip areas 2. A dicing area 5 is provided between the plural chip areas 2. By cutting the semiconductor wafer 3A along the dicing areas 5, the plural chip areas 2, 2 . . . are respectively segmented, so that semiconductor chips are fabricated.

In cutting the semiconductor wafer 3A, first, as illustrated in FIG. 2A, a groove 1 is formed along the dicing area 5 from the first surface 3a side on the semiconductor wafer 3A. The groove 1 of the semiconductor wafer 3A is formed by using a blade 6 which has a blade thickness corresponding to a width of the dicing area 5, for example. A depth of the groove 1 is set to be smaller than a thickness of the semiconductor wafer 3A and larger than a thickness of a semiconductor chip at a finish time. The groove 1 can be formed by hatching or the like. By forming the groove (dicing groove) 1 with such a depth in the semiconductor wafer 3A, the plural chip areas 2 are partitioned into states each corresponding to the finished thickness of the semiconductor chip.

Figure 2B:
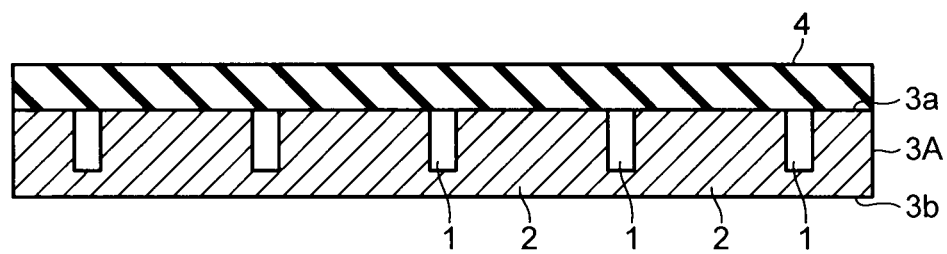

Next, as illustrated in FIG. 2B, a surface protective film 4 is attached to the first surface 3a of the semiconductor wafer 3A in which the dicing groove 1 is formed. The surface protective film 4 protects the semiconductor element part provided in the chip area 2 in grinding the second surface (rear surface) 3b of the semiconductor wafer 3A in a downstream process, and maintains a shape of the semiconductor wafer 3A after segmentation of the chip region 2 in a grinding process of the second surface 3b. As the surface protective film 4, a resin film such as a polyethylene terephthalate (PET) film which has a tacky layer, for example, is used.

Figure 2C:
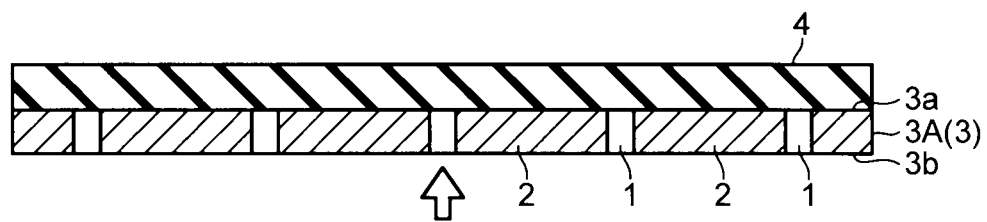

Next, as illustrated in FIG. 2C, the second surface (rear surface) 3b of the semiconductor wafer 3A to which the surface protective film 4 is attached is ground and polished. The second surface 3b of the semiconductor wafer 3A is mechanically ground by using a wrapping plate for example, and subsequently polished by using a polishing plate (dry polishing, for example). A grinding/polishing process of the second surface 3b of the semiconductor wafer 3A is performed in a manner to reach the dicing groove 1 formed from the first surface 3a. As described above, by girding the second surface 3b of the semiconductor wafer 3A, the respective chip areas 2 are each segmented.

In this stage, the respective chip areas 2 are held by the surface protective film 4 though segmented, and thus, as a whole the wafer shape is maintained. In other words, as illustrated in FIG. 2C, the semiconductor wafer 3 which has plural chip areas 2, 2 . . . segmented by the dicing grooves 1 and whose wafer shape is maintained by the surface protective film 4 attached to the first surface 3a is fabricated. Between the segmented chip areas 2, there exists a space equivalent to the width of the dicing groove 1. A fabricating process of the semiconductor wafer 3 is not limited to the dicing-before-grinding process, but a dicing process by a laser beam or the like can be applied.

Figure 1B:
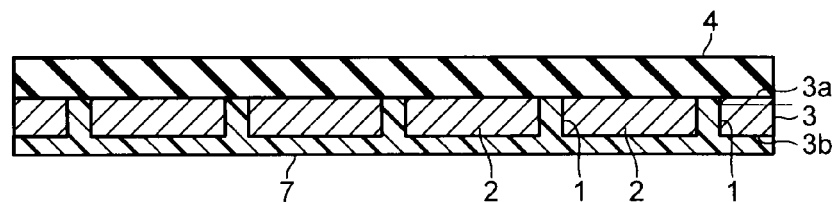

As illustrated in FIG. 1B, a liquid adhesive is applied to the second surface 3b of the semiconductor wafer 3 whose entire shape is maintained by the surface protective film 4, thereby to form an adhesive layer 7. The liquid adhesive, while filled into at least part of the dicing groove 1, is applied to the second surface 3a of the semiconductor wafer 3. As the liquid adhesive, a liquid composition of a thermosetting resin such as an epoxy resin or a polyimide resin, for example, is used. Further, it is possible to use a liquid composition of a photo- and thermo-setting resin or of a resin which cures reversibly by moisture evaporation and re-wetting (reactivated adhesive).

As a method for applying the liquid adhesive to the second surface 3b of the semiconductor wafer 3, an ink jet method, a spray method, a roll coater method, a screen print method and the like, for example, are applied. It is more preferable to apply the ink jet method and the spray method by which the liquid adhesive can be applied in a state of non-contact with the semiconductor wafer 3. Further, since an applied layer of the liquid adhesive with a small thickness can be formed comparatively evenly by the ink jet method, the ink jet method is suitable as the applying method of the liquid adhesive to the semiconductor wafer 3.

The adhesive layer 7 functions as a bonding layer when the segmented chip area 2 (semiconductor chip) is mounted on a wiring board or another semiconductor chip, and is cut (segmented) in correspondence with an outer shape of the semiconductor chip. It is preferable that a thickness of the adhesive layer 7 is in a range of 1 to 20 μm. It is preferable that the adhesive layer 7 has been made in a state in which an adhesion (tack strength) is not exhibited at a room temperature before a next stage. For example, if a liquid composition (stage A) of a thermosetting resin is used as the liquid adhesive, it is preferable that the adhesive layer 7 is made to be in a half-cured state (stage B) by drying an applied layer of the liquid adhesive at a predetermined temperature. In a case that a resin other than a thermosetting type is used also, it is preferable that a processing corresponding to a cure type has been performed.

In forming the adhesive layer 7 by applying the liquid adhesive to the second surface 3b of the semiconductor wafer 3 in which the dicing groove 1 is formed in advance, if the liquid adhesive is simply applied to an entire surface of the semiconductor wafer 3, the liquid adhesive flows into the dicing grooves 1, and thus it is difficult to even a thickness of the adhesive layer 7 on each chip area 2. For example, if an adhesive layer 7 with a film thickness of 10 μm is to be formed, simply applying a liquid adhesive to the entire surface of the semiconductor wafer 3 makes a thickness of a center portion of a chip area (size: 11×13 mm) 2 be about 20 μm and a thickness at a place 50 μm from an end portion be about 1 to 2 μm. When the thickness of the adhesive layer 7 is uneven, adhesive failure is apt to occur in a die bonding process being a downstream process.

Figure 3A:
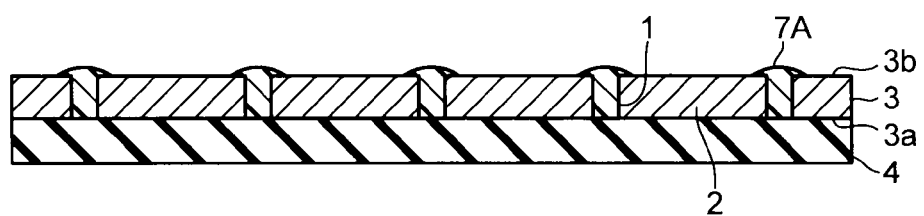
FIG. 3A to FIG. 3C are cross-sectional diagrams illustrating a forming process of an adhesive layer in the method for manufacturing the semiconductor device of the embodiment.

With regard to the above, it is preferable to apply a forming process of an adhesive layer 7 which has a first process of filling a liquid adhesive into dicing grooves 1 and a second process of applying the liquid adhesive to a second surface 3b of a semiconductor wafer 3. The forming process of the adhesive layer 7 will be described with reference to FIG. 3A to FIG. 3C. First, as illustrated in FIG. 3A, a liquid adhesive 7A is filled into dicing grooves 1 with a width of about 30 to 40 μm. On this occasion, since there is a possibility that an alignment property of each chip region 2 is reduced at a time of dicing of a semiconductor wafer 3 (3A) (the dicing grooves 1 are displaced), it is preferable to fill the liquid adhesive 7A into the dicing grooves 1 by applying the liquid adhesive 7A to a width equal to or more than the width of the dicing groove 1 (1.5-fold or more and 3-fold or less of the groove width, for example).

Figure 3B:
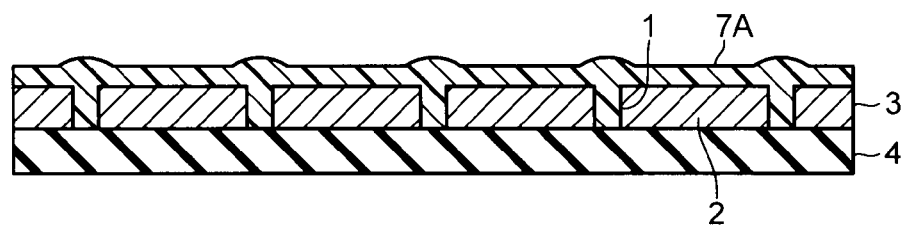
Figure 3C:
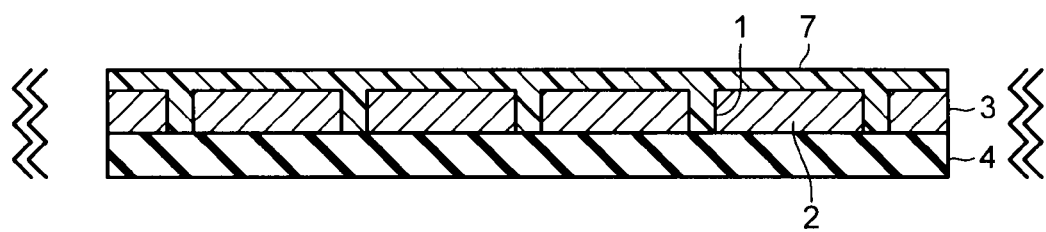

As illustrated in FIG. 3B, the liquid adhesive 7A is applied to the entire of the second surface 3b of the semiconductor wafer 3 in which the liquid adhesive 7A has been filled into the dicing grooves 1. In this stage, compared with a case that the liquid adhesive 7A is simply applied onto the entire surface of the semiconductor wafer 3, an plane evenness of the adhesive layer 7 in each chip area 2 can be substantially heightened. However, there is a case that a thickness of the adhesive layer 7 becomes partially uneven due to a swell onto the second surface 3b in filling the liquid adhesive 7A into the dicing grooves 1, displacement of the liquid adhesive 7A from the dicing grooves 1 at a time of filling, and so on. In such a case, as illustrated in FIG. 3C, it is preferable to oscillate the entire semiconductor wafer 3 in which the liquid adhesive 7A is applied to even an applied thickness of the liquid adhesive 7A. In other words, it is preferable to planarize an unleveled portion of an applied layer of the liquid adhesive 7A.

As a method for oscillating the semiconductor wafer 3, there can be cited mechanically swinging the semiconductor wafer 3 backward/forwards and from side to side, performing a precession movement to the semiconductor wafer 3, applying an ultrasonic wave to the semiconductor wafer 3, and so on. By oscillating the semiconductor wafer 3 by such a method, the unleveled portion of the applied layer of the liquid adhesive 7A can be planarized, so that the in-plane evenness of the film thickness of the adhesive layer 7 can be heightened even more. An in-plane dispersion of the film thickness of the adhesive layer 7 can be made equal to or less than 30%, for example. The in-plane dispersion of the film thickness is calculated, obtaining a maximum value and a minimum value by measuring the film thickness of the adhesive layer 7 in the chip area 2, from a formula

[{(maximum value−minimum value)/(maximum value+minimum value)}×100(%)].

For example, in forming an adhesive layer 7 with a film thickness of 10 μm in a chip area 2 with a size of 11×13 mm, first a liquid adhesive 7A is filled into a dicing groove 1 with a width of 30 to 40 μm (filling width=1.5 fold of groove width), and thereafter, the liquid adhesive 7A is applied to a second surface 3b of a semiconductor wafer 3. Further, if the entire semiconductor wafer 3 is oscillated, it is possible to make a thickness of a center portion of a chip area 2 be about 13 μm and fruther to make a thickness of an end portion of the chip area 2 be about 7 μm. When an in-plane dispersion of a film thickness (in-plane distribution of film thickness) in this case is put into the above formula, a calculation is carried out as {(13−7)/(13+7)}×100=30(%).

By heightening the plane evenness of the film thickness of the adhesive layer 7 in the chip area 2, the adhesive failure in the die-bonding process of the semiconductor chip can be suppressed. Further, as a result that the in-plane evenness of the film thickness of the adhesive layer 7 is heightened while the adhesive is filled into the dicing groove 1, it becomes possible to improve a success rate of a cleaving process of the adhesive layer 7 being a downstream process. In an expanding process described later, since a start point of cleavage is easy to occur in the adhesive filled into the dicing groove 1, a cleavage property of the adhesive layer 7 can be heightened. In addition, the adhesive filled into the dicing groove 1 can be made function as a layer to protect a side surface of the semiconductor chip.

Figure 1C:
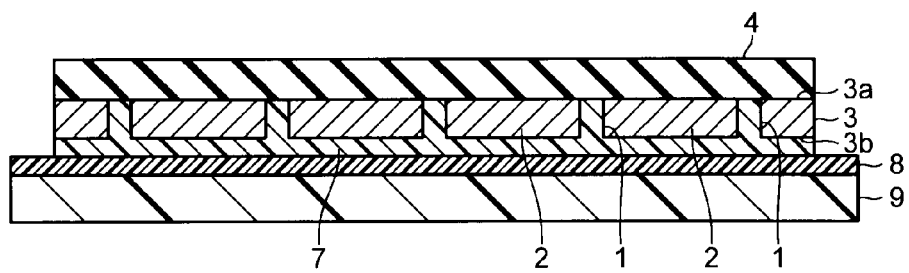

As illustrated in FIG. 1C, a supporting sheet 9 having a tacky layer 8 is attached to the second surface 3b of the semiconductor wafer 3 via the adhesive layer 7. The supporting sheet 9 is attached to the semiconductor wafer 3 in a manner that the tacky layer 8 contacts the adhesive layer 7. The tacky layer 8 is made of a material whose tack strength can be reduced. As such a tacky material, there can be cited an ultraviolet-setting resin which sets by radiation of an ultraviolet ray thereby reducing a tack strength, a photo- and thermo-setting resin which sets by radiation of a laser beam or the like thereby reducing a tack strength, a resin whose tack strength is reduced at a cooling time based on a thermal expansion difference from a resin composing the adhesive layer 7 and so on. As the supporting sheet 9 having the tacky layer 8, an ultraviolet-setting tacky tap can be used. The ultraviolet-setting tacky tape is a tape made by forming a tacky layer composed of an ultraviolet-setting resin on a base sheet composed of a polyolefin resin such as polyethylene or polypropylene, a polyvinyl chloride resin, or the like.

Figure 1D:
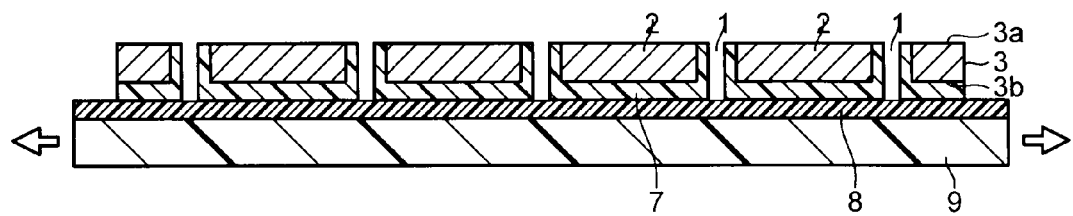

As illustrated in FIG. 1D, after the surface protective film 4 is peeled from the semiconductor wafer 3, the supporting sheet 9 is expanded in a horizontal direction (direction parallel to the surfaces 3a, 3b of the semiconductor wafer 3), thereby to cleave the adhesive layer 7 including the adhesive filled into the dicing groove 1. By cleaving the adhesive layer 7 in accordance with a shape of the chip area 2, the adhesive layer 7 is formed in each chip area 2. That is, the chip area 2 having the segmented adhesive layer 7, in other words, a semiconductor chip having the adhesive layer 7 with a segmented shape is fabricated.

Figure 4A:
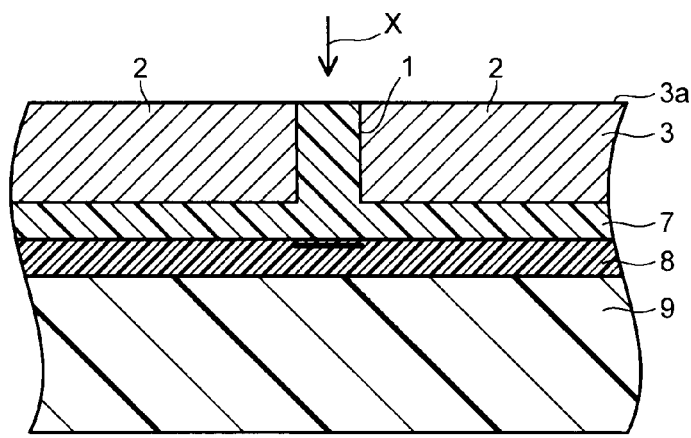
FIG. 4A to FIG. 4C are cross-sectional diagrams illustrating a first example of a cleaving process of the adhesive layer in the method for manufacturing the semiconductor device of an embodiment.

Before the cleaving process of the adhesive layer 7, the tack strength of portions corresponding to the dicing grooves 1 of the tacky layer 8 is selectively reduced. When the tacky layer 8 is composed of an ultraviolet-setting resin, an ultraviolet ray X is radiated from a first surface 3a side of the semiconductor wafer 3 as illustrated in FIG. 4A. The ultraviolet ray X radiated to the first surface 3a of the semiconductor wafer 3 is intercepted by the chip areas 2 as a mask, and is transmitted only in the dicing grooves 1 and sets the portions corresponding to the dicing grooves 1 of the tacky layer 8 selectively. That is, it is possible to selectively reduce the tack strength of the portions corresponding to the dicing grooves 1 of the tacky layer 8.

When a photo- and thermo-setting resin is used as the tacky layer 8, by radiating a laser beam into the dicing grooves 1 for example, the tack strength of the portions corresponding to the dicing grooves 1 of the tacky layer 8 is reduced. By focusing the laser beam on the tacky layer 8, it is possible to selectively set only the portions corresponding to the dicing grooves 1 of the tacky layer 8 without setting the adhesive layer 7 in the dicing grooves 1. In other words, it is possible to selectively reduce the tack strength of the portions corresponding to the dicing grooves 1 of the tacky layer 8. In a case that another resin is used also, tack strength of the portions corresponding to the dicing grooves 1 of the tacky layer 8 is selectively reduced by applying a processing corresponding to a reduction type of the tack strength.

Figure 4B:
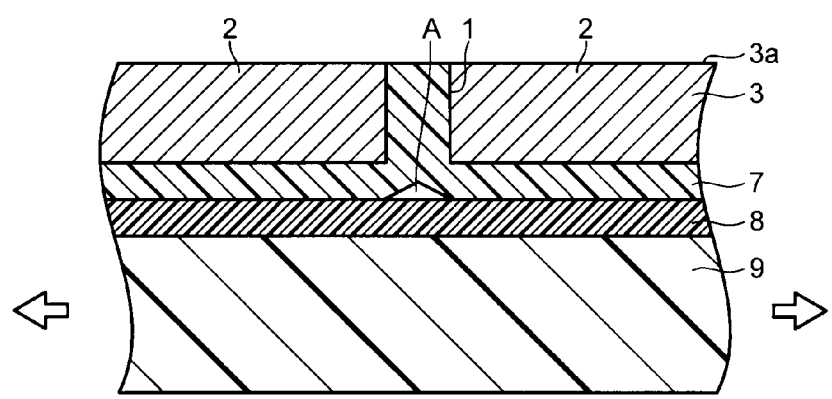
Figure 4C:
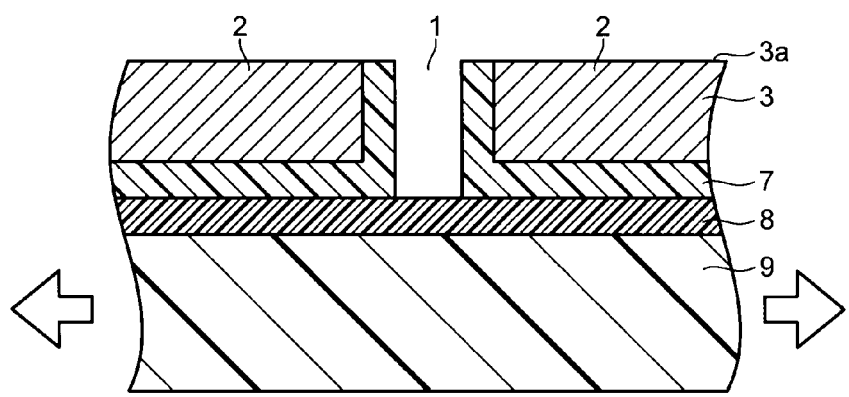

If the tack strength of the portion corresponding to the dicing groove 1 of the tacky layer 8 is selectively reduced and thereafter the supporting sheet 9 is expanded in the horizontal direction, a start point A of cleavage occurs in a portion in which an adhesive state of the adhesive layer 7 is released from the tacky layer 8, as illustrated in FIG. 4B. That is, the start point A of cleavage occurs in a portion of the adhesive layer 7 in which an interface with the tacky layer 8 is formed in the dicing groove 1. As illustrated in FIG. 4C, by increasing an expand amount of the supporting sheet 9 from the above state, the adhesive layer 7 can be satisfactorily cleaved including the adhesive in the dicing groove 1. Since a cleavage property of the adhesive layer 7 in the dicing groove 1 by the expansion of the supporting sheet 9 is improved, it becomes possible to heighten a cleavage success rate of the adhesive layer 7.

Figure 5A:
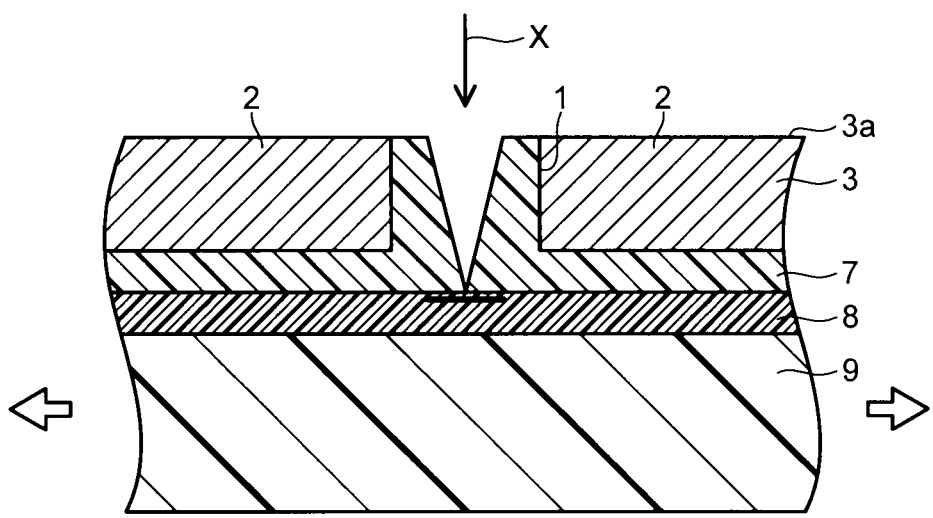
FIG. 5A and FIG. 5B are cross-sectional diagrams illustrating a second example of the cleaving process of the adhesive layer in the method for manufacturing the semiconductor device of the embodiment.
Figure 5B:
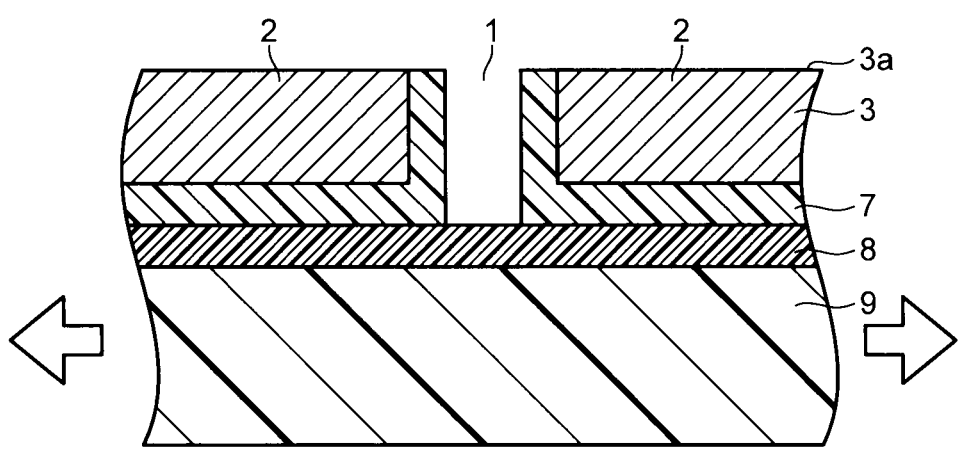

In a case that an adhesive layer 7 does not transmit an ultraviolet ray for example, a supporting sheet 9 is expanded in a horizontal direction to cleave a part of the adhesive layer 7, and thereafter, while an expansion state of the supporting sheet 9 is maintained, an ultraviolet X is radiated from a first surface 3a side of a semiconductor wafer 3, as illustrated in FIG. 5A. The ultraviolet ray X is radiated to a tacky layer 8 via a cleaved part of the adhesive layer 7, thereby to selectively set the portion corresponding to the dicing groove 1 of the tacky layer 8 to reduce the tack strength. Thereby, as illustrated in FIG. 5B, a bottom portion (portion in which an interface with the tacky layer 8 is formed) of the adhesive layer 7 existing in the dicing groove 1 can be satisfactorily cleaved.

Figure 6:
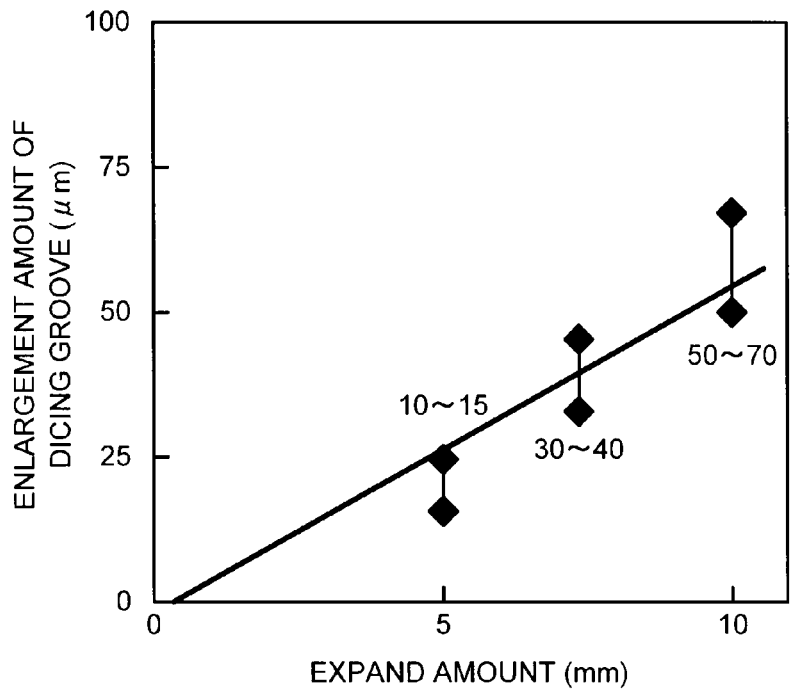
FIG. 6 is a graph representing a relation between a stretch amount of a supporting film and an enlargement amount of a dicing groove width in the embodiment.
Figure 7:
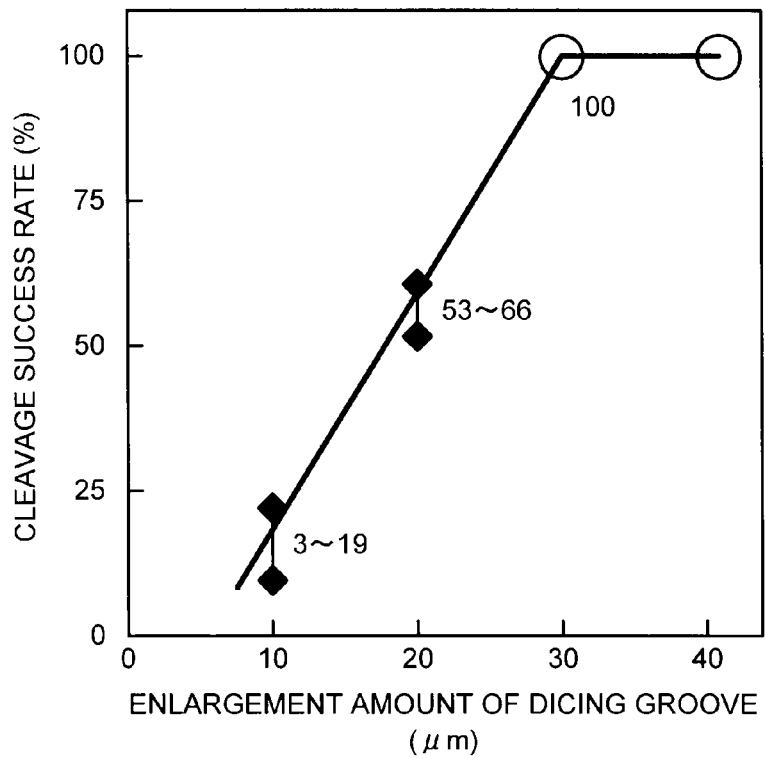
FIG. 7 is a graph representing a relation between the enlargement amount of the dicing groove width and a cleavage success rate of the adhesive layer in the embodiment.

FIG. 6 represents a relation between an expand amount of a supporting sheet 9 and an enlargement amount of a dicing groove 1. FIG. 7 represents a relation between an enlargement amount of a dicing groove 1 and a cleavage success rate of an adhesive layer 7. As is obvious from FIG. 6 and FIG. 7, by selectively reducing a tack strength of a portion corresponding to a dicing groove 1 of a tacky layer 8 and making an enlargement amount of the dicing groove 1 be equal to or more than 30 μm, the cleavage success rate of the adhesive layer 7 can be made to be 100%. This is not influenced by an initial groove width of the dicing groove 1. By making the enlargement amount of the dicing groove 1 be equal to or more than 30 μm regardless of the initial groove width of the dicing groove 1, the cleavage success rate of the adhesive layer 7 is substantially improved.

As described above, by selectively reducing the tack strength of the portions corresponding to the dicing grooves 1 of the tacky layer 8, it is possible to heighten the cleavage success rate of the adhesive layer 7 in the expanding process of the supporting sheet 9. A process of selectively reducing the tack strength of the portions corresponding to the dicing grooves 1 of the tacky layer 8 can be performed any time of before the expanding process of the supporting sheet 9, at the expanding process, and after the expanding process. It is also possible that the tack strength of the portion corresponding to the dicing groove 1 of the tacky layer 8 is selectively reduced in a stage of a tacky sheet (before attaching to the semiconductor wafer 3). It suffices if the selective reducing process of the tack strength of the tacky layer 8 is performed before a cleaning process described later.

Further, by selectively reducing the tack strength of the portions corresponding to the dicing grooves 1 of the tacky layer 8, occurrence of an inconvenience due to cleavage of the adhesive layer 7 can be suppressed. If the tack strength of the tacky layer 8 is not selectively reduced, resin pieces scattering at a time of cleaving the adhesive layer 7 increases. In addition, since a part in which cleavage is insufficient is apt to occur in the dicing groove 1, there is a possibility that the resin piece having scattered in the dicing groove 1 or a resin residue cannot be removed even if the cleaning process being a downstream process is performed. The adhesive layer 7 in the dicing groove 1 is forcibly torn off from a state illustrated in FIG. 5A, a burr (whisker burr or the like) occurs in a cleavage edge, and the burr drops at a time of picking up of a semiconductor chip and contaminates an electrode pad or the like, causing a connection failure. The cleaved resin piece having scattered, the burr occurring in the cleavage edge, or the like triggers increase of a failure occurrence rate of the semiconductor chip.

With regard to such a point, by selectively reducing the tack strength of the portion corresponding to the dicing groove 1 of the tacky layer 8, the cleavage property of the adhesive layer 7 in the dicing groove 1 is improved, so that a resin piece amount scattering at the time of cleavage can be reduced. Further, it is possible to suppress occurrence of a burr (whisk burr or the like) in the cleavage edge. The resin piece having scattered in the dicing groove 1, the resin residue, or the like can be removed sufficiently in the cleaning process being the downstream process. Thereby, it becomes possible to reduce a failure incidence of a semiconductor chip due to a rein piece having scattered, a resin residue, a burr occurring in a cleavage edge, or the like.

Failure incidents of semiconductor chips due to a cleavage resin piece having scattered, dropping of a burr at a time of picking up, or the like are compared in a case that a tack strength of a tacky layer 8 is selectively reduced before a cleaning processing (example) and in a case that selective reducing of a tack strength of a tacky layer 8 is not performed (comparative example). In both cases, cleaning processes being downstream processes are performed. As a result, in the case that the tack strength of the tacky layer 8 is selectively reduced before the cleaning process, the failure incidence of the semiconductor chip is 0%, and in contrast, in the case that the tack strength of the tacky layer 8 is not selectively reduced, the failure incidence of the semiconductor chip rises to as high as 16%. Based on reduction of the failure incidence of the semiconductor chip and improvement of the cleavage success rate of the adhesive layer 7, it is possible to improve a manufacturing yield of the semiconductor chip and a semiconductor device using the same.

Thereafter, while the expansion state of the supporting sheet 9 is maintained, the first surface 3a of the semiconductor wafer 3 and the inside of the dicing groove 1 are cleaned. As the cleaning process, it is preferable to apply two-fluid cleaning, ultrasonic cleaning, ultrasonic cleaning using high temperature water, cleaning by spraying ice, cleaning by heated vapor, and the like, for example. The two-fluid cleaning is a method for cleaning in which mist (liquid droplet) generated by mixing pure water or the like into accelerated gas such as air is collided against a surface to be cleaned at a high speed. By applying such cleaning methods, the resin having scattered or the like is removed effectively. Further, by performing the cleaning process while maintaining the state in which the supporting sheet 9 is expanded, the resin piece, the resin residue and the like in the dicing groove 1 can be removed effectively. Accordingly, the failure incident of the semiconductor chip is reduced.

The cleaning process can be performed in a manner that all the adhesive existing in the dicing groove 1 is removed, but it is preferable to perform the cleaning in a manner that the adhesive remaining in a side surface of the chip area 2 is left and that only the resin piece having scattered in the dicing groove 1 and the resin residue are removed. The adhesive remaining in the side surface of the chip area 2 after cleavage of the adhesive layer 7 functions as a protective film of the semiconductor chip, and thus it is preferable to let the adhesive to exist in the side surface of the semiconductor chip. Thereby, damage or the like of the semiconductor chip due to filler in resin sealing the semiconductor chip can be suppressed.

Through the respective processes described above, the chip areas (semiconductor chips) 2 having the adhesive layer 7 with the segmented shape are fabricated. According to the manufacturing processes of the present embodiment, it is made possible to improve the cleavage property of the adhesive layer 7 and to effectively remove the resin piece, the resin residue and the like which occur at the time of cleavage. Accordingly, it is possible to curtail a cost required for a cutting process (segmenting process) corresponding to a shape of a chip area 2 of an adhesive layer 7, and to suppress reduction of a manufacturing yield of a semiconductor chip due to a resin piece, a resin residue, a burr and the like which occur at a time of cleavage. Thereby, it is possible to realize cost reduction, high accuracy, and the like of a manufacturing process of a semiconductor chip in which dicing before grinding is applied. Further, reliability and the like of a mounting process of a semiconductor chip being a downstream process can be also improved.

Figure 8:
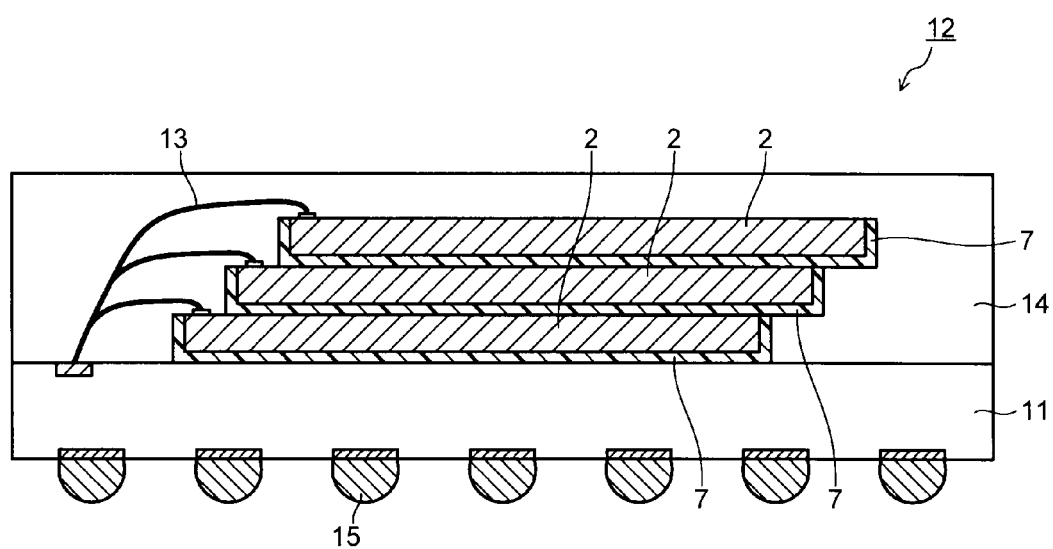
FIG. 8 is a cross-sectional diagram illustrating an example of a semiconductor device using the semiconductor chip fabricated by the manufacturing method of the embodiment.

The semiconductor wafer 3 after finishing the cleaning process is sent to a pick-up process of the semiconductor chips 2, similarly to in an ordinary manufacturing processes of a semiconductor device. That is, the semiconductor chip 2 having the adhesive layer 7 with the segmented shape is picked up from the supporting sheet 9, and thereafter mounted onto a wiring board 11 as illustrated in FIG. 8, for example. Mounting of the semiconductor chip 2 is performed by using the adhesive layer 7. When the semiconductor chips 2 are stacked in multiple layers, onto the semiconductor chip 2 mounted on the wiring board 11, other semiconductor chips 2 are sequentially stacked by the adhesive layers 7, as illustrated in FIG. 8.

In FIG. 8, the wiring board 11 and the semiconductor chip 2 are electrically connected by a metal wire 13. The semiconductor chip 2 is sealed by a sealing resin layer 14 together with the metal wire 13 and so on. An external electrode 15 is provided in a lower surface side of the wiring board 11. FIG. 8 illustrates a semiconductor device 12 made by stacking a plurality of semiconductor chips 2 in a staircase pattern on the wiring board 11. Various known configurations can be applied to the semiconductor device 12. For example, a circuit base to which the semiconductor chip 2 is mounted can be a lead frame. As a stacked structure of the semiconductor chips 2, various stacked structure such as alternate stacking in which an electrode pad is exposed and straight stacking in which an electrode pad is also covered by another chip can be applied. Same applies to configuration other than the above.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for manufacturing a semiconductor device, comprising:
preparing a semiconductor wafer having a plurality of chip areas segmented by dicing grooves, a wafer shape of the semiconductor wafer being maintained by a surface protective film attached to a first surface of the semiconductor wafer;
forming an adhesive layer by applying a liquid adhesive to a second surface in an opposite side of the first surface of the semiconductor wafer while filling the liquid adhesive into at least part of the dicing grooves;
attaching a supporting sheet having a tacky layer whose tack strength can be reduced to the second surface of the semiconductor wafer via the adhesive layer;
peeling the surface protective film from the first surface of the semiconductor wafer;
cleaving the adhesive layer including the adhesive filled into the dicing grooves by expanding the supporting sheet attached to the semiconductor wafer; and
cleaning the first surface of the semiconductor wafer with the inside of the dicing groove while maintaining a state that the supporting sheet is expanded,
wherein the tack strength of portions corresponding to the dicing grooves of the tacky layer is selectively reduced before cleaning the first surface of the semiconductor wafer.

2. The method for manufacturing the semiconductor device according to claim 1,
wherein the tack strength of the portions corresponding to the dicing grooves of the tacky layer is selectively reduced before the supporting sheet is expanded.

3. The method for manufacturing the semiconductor device according to claim 1,
wherein the tack strength of the portions corresponding to the dicing grooves of the tacky layer is selectively reduced after the supporting sheet is expanded.

4. The method for manufacturing the semiconductor device according to claim 1,
wherein the tacky layer is made of an ultraviolet-setting resin whose tack strength is reduced by radiation of an ultraviolet ray, a photo- and thermo-setting resin whose tack strength is reduced by radiation of a light, or a resin whose tack strength is reduced based on a difference in thermal expansion coefficient from the adhesive layer when cooling.

5. The method for manufacturing the semiconductor device according to claim 4,
wherein the tacky layer is made of the ultraviolet-setting resin; and
wherein an ultraviolet ray is selectively radiated to the portions corresponding to the dicing grooves of the tacky layer thereby to selectively reduce the tack strength of the tacky layer.

6. The method for manufacturing the semiconductor device according to claim 5,
wherein the ultraviolet ray is radiated from the first surface side of the semiconductor wafer before the supporting sheet is expanded, and then the supporting sheet is expanded to cleave the adhesive layer.

7. The method for manufacturing the semiconductor device according to claim 5,
wherein the ultraviolet ray is radiated from the first surface side of the semiconductor wafer after the supporting sheet is expanded, and then the supporting sheet is further expanded to cleave the adhesive layer.

8. The method for manufacturing the semiconductor device according to claim 4,
wherein the tacky layer is made of the photo- and thermo-setting resin; and
wherein a laser beam is selectively radiated to the portions corresponding to the dicing grooves of the tacky layer to selectively reduce the tack strength of the tacky layer.

9. The method for manufacturing the semiconductor device according to claim 1,
wherein the adhesive layer is left in side surfaces of the chip areas.

10. The method for manufacturing the semiconductor device according to claim 1, wherein the adhesive layer is formed by filling the liquid adhesive into the dicing groove and then applying the liquid adhesive to the second surface of the semiconductor wafer.

11. The method for manufacturing the semiconductor device according to claim 10,
wherein the semiconductor wafer is oscillated after the liquid adhesive is applied to the second surface of the semiconductor wafer.

12. The method for manufacturing the semiconductor device according to claim 10,
wherein an plane dispersion of a thickness of the adhesive layer is 30% or less.

13. The method for manufacturing the semiconductor device according to claim 1,
wherein the semiconductor wafer is prepared by dicing before grinding.

14. A method for manufacturing a semiconductor device, comprising:
preparing a semiconductor wafer having a plurality of chip areas segmented by dicing grooves, a wafer shape of the semiconductor wafer being maintained by a surface protective film attached to a first surface of the semiconductor wafer;
filling a liquid adhesive into the dicing grooves from a second surface side being an opposite side of the first surface of the semiconductor wafer;
applying the liquid adhesive to the second surface of the semiconductor wafer to form an adhesive layer including the adhesive filled into the dicing grooves;
attaching a supporting sheet having a tacky layer to the second surface of the semiconductor wafer via the adhesive layer;
peeling the surface protective film from the first surface of the semiconductor wafer;
cleaving the adhesive layer including the adhesive filled into the dicing grooves by expanding the supporting sheet attached to the semiconductor wafer; and
cleaning the first surface of the semiconductor wafer including the inside of the dicing groove while maintaining a state that the supporting sheet is expanded.

15. The method for manufacturing the semiconductor device according to claim 14,
wherein the semiconductor wafer is oscillated after the liquid adhesive is applied to the second surface of the semiconductor wafer.

16. The method for manufacturing the semiconductor device according to claim 15,
wherein the semiconductor wafer is oscillated by mechanically swinging the semiconductor wafer, performing a precession movement to the semiconductor wafer, or applying an ultrasonic wave to the semiconductor wafer.

17. The method for manufacturing the semiconductor device according to claim 14,
wherein the liquid adhesive is filled into the dicing groove by applying the liquid adhesive in a width of 1.5-fold to 3-fold of a width of the dicing groove.

18. The method for manufacturing the semiconductor device according to claim 14,
wherein an plane dispersion of a thickness of the adhesive layer is 30% or less.

19. The method for manufacturing the semiconductor device according to claim 14,
the adhesive layer is left in side surfaces of the chip areas.

* * * * *